United States Patent
Zhou et al.

(10) Patent No.: US 12,328,841 B2
(45) Date of Patent: Jun. 10, 2025

(54) AIR DEFLECTION PLUG-IN UNIT, CABINET, ELECTRONIC DEVICE, AND MANUFACTURING METHOD FOR AIR DEFLECTION PLUG-IN UNIT

(71) Applicant: HUAWEI TECHNOLOGIES CO., LTD., Shenzhen (CN)

(72) Inventors: Lujun Zhou, Nanjing (CN); Tao Yan, Dongguan (CN); Guangming Zheng, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 266 days.

(21) Appl. No.: 18/187,686

(22) Filed: Mar. 22, 2023

(65) Prior Publication Data

US 2023/0225075 A1      Jul. 13, 2023

Related U.S. Application Data

(63) Continuation of application No. PCT/CN2021/104816, filed on Jul. 6, 2021.

(30) Foreign Application Priority Data

Sep. 30, 2020   (CN) .......................... 202011063409.X
Dec. 16, 2020   (CN) .......................... 202011492085.1

(51) Int. Cl.
      *H05K 7/20* (2006.01)
(52) U.S. Cl.
      CPC ................ *H05K 7/20145* (2013.01)

(58) Field of Classification Search
CPC .. H05K 7/20736; H05K 7/20145; H05K 7/20; H05K 5/0286; H05K 7/1487; H05K 7/1489; H05K 7/20554; H05K 7/20718; G06F 1/20; G06F 1/181; G06F 2200/201
USPC .......... 361/695, 724, 679.46, 688, 690, 752, 361/679.49, 692, 694, 725, 796
See application file for complete search history.

(56) References Cited

U.S. PATENT DOCUMENTS

| | | | |
|---|---|---|---|
| 5,528,454 A * | 6/1996 | Niklos | ............... H05K 7/20581 361/679.48 |
| 9,706,681 B2 * | 7/2017 | Henkel | ............... H05K 7/1465 |
| 2008/0233858 A1 * | 9/2008 | Womac | ................. H05K 7/18 454/184 |
| 2013/0033816 A1 | 2/2013 | Fu | |
| 2016/0143180 A1 * | 5/2016 | Zhu | ................... H05K 7/20572 165/80.2 |

(Continued)

FOREIGN PATENT DOCUMENTS

| | | |
|---|---|---|
| CN | 103092297 A | 5/2013 |
| CN | 103732035 A | 4/2014 |
| CN | 206100749 U | 4/2017 |

(Continued)

*Primary Examiner* — Mandeep S Buttar

(57) ABSTRACT

An air deflection plug-in unit includes a housing and a flow guiding structure. The housing is provided with a first air intake vent and a first air exhaust vent, and there is an included angle between planes on which the first air intake vent and the first air exhaust vent are located. The flow guiding structure is located in the housing. The flow guiding structure is configured to guide an airflow flowing into the first air intake vent to the first air exhaust vent. This disclosure can improve a heat dissipation capability of an electronic component.

18 Claims, 5 Drawing Sheets

(56) References Cited

U.S. PATENT DOCUMENTS

2022/0418164 A1* 12/2022 Shearman .......... H05K 7/20563

FOREIGN PATENT DOCUMENTS

| CN | 206547232 U | 10/2017 |
|----|-------------|---------|
| CN | 210124059 U | 3/2020  |
| TW | M471616 U   | 2/2014  |

* cited by examiner

AIR DEFLECTION PLUG-IN UNIT, CABINET, ELECTRONIC DEVICE, AND MANUFACTURING METHOD FOR AIR DEFLECTION PLUG-IN UNIT

CROSS-REFERENCE TO RELATED APPLICATIONS

This disclosure is a continuation of International Application No. PCT/CN2021/104816, filed on Jul. 6, 2021, which claims priority to Chinese Patent Application No. 202011063409.X, filed on Sep. 30, 2020 and Chinese Patent Application No. 202011492085.1, filed on Dec. 16, 2020. All of the aforementioned applications are hereby incorporated by reference in their entireties.

TECHNICAL FIELD

This disclosure relates to the field of communication devices, and in particular, to an air deflection plug-in unit, a cabinet, an electronic device, and a manufacturing method for an air deflection plug-in unit.

BACKGROUND

A data center has a large number of switches. The switch mainly includes a main control card, a line card, and a switch fabric unit. The main control card functions as the brain of a switch and performs a control function. The line card mainly provides various ports of different rates, and the switch fabric unit provides high-speed interconnection between line cards.

In a related technology, a cabinet is usually used to carry a switch. The cabinet mainly includes a cabinet body, a fan group, and a plurality of service carrier boards. The service carrier board is configured to carry the line card. The cabinet body is provided with a plurality of slots capable of accommodating the service carrier boards, and the slots are sequentially stacked from top to bottom and are in communication with each other. The fan group is located on one side of the slots, to guide an airflow to flow through the slots and dissipate heat for the line cards inserted in the slots. In actual application, the slots are usually vacant (in which no service carrier boards are inserted). The vacant slots provide bypasses for airflows, so that the airflows overflow from the vacant slots. As a result, an air volume of a slot in which the service carrier board is inserted decreases, and the line card cannot achieve a good heat dissipation effect. To resolve such a problem, air baffles are usually inserted into the vacant slots to block airflows, thereby reducing airflow bypasses.

However, since some airflows are blocked by the air baffles, only some slots can be used for air intake, which reduces a total air intake volume, affecting the heat dissipation effect of the cabinet.

SUMMARY

Embodiments of this disclosure provide an air deflection plug-in unit, a cabinet, an electronic device, and a manufacturing method for an air deflection plug-in unit, to overcome a problem in a related technology that a heat dissipation effect of an electronic component is poor.

According to a first aspect, an air deflection plug-in unit is provided. The air deflection plug-in unit is applied to a cabinet and includes a housing and a flow guiding structure. The housing is provided with a first air intake vent and a first air exhaust vent, and there is an included angle between planes on which the first air intake vent and the first air exhaust vent are located, that is, overflowing directions of the first air intake vent and the first air exhaust vent are different. The overflowing direction refers to a flow direction of an airflow passing through the position. To be specific, the airflow passes through the first air intake vent and the first air exhaust vent in different directions. The flow guiding structure is located in the housing. The flow guiding structure is configured to guide an airflow flowing into the first air intake vent to the first air exhaust vent. Since the overflowing directions of the first air intake vent and the first air exhaust vent are different, direction change and guiding of the airflow can be implemented. In this way, after the air deflection plug-in unit is applied to the cabinet, an airflow in the cabinet can be guided through the air deflection plug-in unit, so that the air deflection plug-in unit not only blocks no airflow, but also guides the airflow to another required position (a position in which an electronic component is disposed) in the cabinet, thereby ensuring a total air intake volume of the cabinet, and improving the heat dissipation effect of the electronic component.

The air deflection plug-in unit provided in embodiments of this disclosure has at least the following effects.

After the air deflection plug-in unit is applied to the cabinet, some airflows flow through a position where an electronic component is located, to directly dissipate heat for the electronic component. Some other airflows flow through the air deflection plug-in unit. After entering through the first air intake vent, the airflows are guided to the first air exhaust vent under an action of the flow guiding structure. The airflow is outputted from the first air exhaust vent and is guided to a position in the cabinet where the electronic component is arranged. In this way, heat dissipation can also be performed on the electronic component. It can be learned that, for the cabinet, both an airflow flowing through the air deflection plug-in unit and an airflow not flowing through the air deflection plug-in unit can dissipate heat for the electronic component. In this way, a problem of airflow overflow is resolved, and the total air intake volume is ensured. In addition, since the air deflection plug-in unit no longer blocks airflows, noise generated due to airflow impact is also reduced.

In an exemplary embodiment, the housing includes an upper cover plate, a lower cover plate, and an end plate. The upper cover plate and the lower cover plate are opposite to each other, to provide a space basis for an airflow. The end plate is located between the upper cover plate and the lower cover plate, one side edge of the end plate is connected to one side edge of the upper cover plate, and the other opposite side edge of the end plate is connected to one side edge of the lower cover plate, so that the upper cover plate and the lower cover plate are connected by using the end plate. The flow guiding structure includes a first air deflector. The first air deflector is also located between the upper cover plate and the lower cover plate, one side edge of the first air deflector is connected to the upper cover plate, and the other opposite side edge of the first air deflector is connected to the lower cover plate, so that the first air deflector can be securely connected between the upper cover plate and the lower cover plate. In other words, the upper cover plate, the lower cover plate, the end plate, and the first air deflector are connected together to form as a whole. In addition, the upper cover plate, the lower cover plate, the end plate, and the first air deflector enclose a first space, the first air intake vent is located at a position corresponding to the end plate in the first space, and the first air exhaust vent is located at a position corresponding to the lower cover plate in the first space. In other words, the first space can communicate the first air intake vent with the second air exhaust vent. In this design, when an electronic component is arranged at an adjacent position below the air deflection plug-in unit, an airflow enters the first space from the outside and is guided from the first space to the electronic component, to dissipate heat for the electronic component, thereby fully utilizing the airflow, and ensuring the heat dissipation effect.

In an exemplary embodiment, the first air deflector is arranged in an inclined manner, and is inclined from one side edge to the other opposite side edge in a direction away from the first air exhaust vent. In this design, the first air deflector can better guide an airflow entering the first space, so that the airflow can flow along the inclined first air deflector toward the first air exhaust vent, thereby smoothly flowing out of the first space.

In an exemplary embodiment, the flow guiding structure further includes a second air deflector. The second air deflector is also located between the upper cover plate and the lower cover plate, and is located on one side of the first air deflector away from the end plate, that is, the second air deflector is spaced apart from the first air deflector. One side edge of the second air deflector is connected to the upper cover plate, and the other opposite side edge is connected to the lower cover plate, so that the second air deflector is securely connected between the upper cover plate and the lower cover plate. In addition, the upper cover plate, the lower cover plate, and one side of the second air deflector away from the first air deflector enclose a second space, that is, the second space is located on one side of the second air deflector away from the first air deflector. The second space is provided with a second air intake vent. The second air intake vent is located at a position corresponding to the lower cover plate in the second space. In this design, when an electronic component is disposed at an adjacent position below the air deflection plug-in unit, after airflows dissipate heat for the electronic component and flow to a position close to the second air intake vent, some airflows continue to flow in an original direction, and some other airflows flow upward, return to the corresponding second space through the second air intake vent above, and finally flow out of the second space. In other words, flow routes of the airflow after heat dissipation is performed on the electronic component are increased, improving air exhaust uniformity.

In an exemplary embodiment, the second air deflector is arranged in an inclined manner, and is inclined from one side edge to the other opposite side edge in a direction away from the second air intake vent. In this design, the second air deflector can better guide an airflow entering the second space, so that the airflow can flow along the inclined second air deflector and away from the second air deflector, thereby smoothly flowing out of the second space, to dissipate heat.

In an exemplary embodiment, the upper cover plate, the lower cover plate, the first air deflector, and the second air deflector enclose a third space. The third space is located between the first space and the second space. The third space is provided with a third air intake vent and a second air exhaust vent that are respectively located at positions corresponding to the upper cover plate in the third space. In this design, when an air deflection plug-in unit is also arranged at the adjacent position below the air deflection plug-in unit, airflows in a first space of an upper air deflection plug-in unit enter a corresponding third space sequentially through a corresponding first air exhaust vent and a third air intake vent of a lower air deflection plug-in unit, then the airflows further enter a corresponding second space sequentially through a second air exhaust vent of the lower air deflection plug-in unit and a second air intake vent of the upper air deflection plug-in unit, and finally flow out of the second space. That is, when the two air deflection plug-in units are adjacent, airflows that enter the upper air deflection plug-in unit can flow through the third space of the lower air deflection plug-in unit, and finally return to the upper air deflection plug-in unit and flow out, thereby further improving air exhaust uniformity.

In an exemplary embodiment, the cabinet includes a plurality of replaceable air deflection plug-in units. Structures of the air deflection plug-in units are substantially the same, and a difference lies in that a first air intake vent, a second air intake vent, a third air intake vent, a first air exhaust vent, and a second air exhaust vent of each of the air deflection plug-in units have various sizes. In this design, a user can select an air deflection plug-in unit of an appropriate size according to an actual requirement, so as to control an amount and a flow rate of airflows, thereby improving applicability of the cabinet.

According to a second aspect, a cabinet is provided, including a cabinet body, a fan group, an air deflection plug-in unit, and a service carrier board. The cabinet body is configured to provide a mounting basis for the fan group, the air deflection plug-in unit, and the service carrier board, so that the cabinet is an integral part capable of carrying various electronic components such as a line card. A slot space is provided in the cabinet body, and the slot space is further divided into a plurality of slots that are stacked in sequence and in communication with each other. Each of the slots is configured to accommodate an air deflection plug-in unit or a service carrier board. In other words, an air deflection plug-in unit is inserted into each slot in which the service carrier board is not inserted. The air deflection plug-in unit and the service carrier board are respectively detachably inserted into the slot, so as to facilitate replacement of the air deflection plug-in unit and the service carrier board in the slot. The service carrier board is used to carry a line card, to provide a mounting basis for the line card. The fan group is arranged in the cabinet body. The fan group and the slot space are arranged side by side, so that airflows generated by the fan group can flow through the slot space. Some airflows flow through a slot in which the service carrier board is inserted, to dissipate heat for the line card mounted on the service carrier board. Some other airflows flow through a slot in which the air deflection plug-in unit is inserted. Since the air deflection plug-in unit can guide airflows in the slot in which the air deflection plug-in unit is located to an adjacent slot, the airflows are finally guided to the slot in which the service carrier board is inserted, to further dissipate heat for the line card.

The cabinet provided in embodiments of this disclosure has at least the following effects.

When an electronic component such as a line card is accommodated in the cabinet provided in embodiments of this disclosure, the fan group operates to form airflows that flow through the slot space. Some airflows flow through a slot in which the service carrier board is inserted, to directly dissipate heat for the line card mounted on the service carrier board. Some other airflows flow through a slot in which the air deflection plug-in unit is inserted. Since the air deflection plug-in unit can guide airflows in the slot in which the air deflection plug-in unit is located to an adjacent slot, the airflows are finally guided to the slot in which the service carrier board is inserted, which can also dissipate heat for the line card mounted on the service carrier board. As can be seen from the above, air can enter both the slot in which the service carrier board is inserted and the slot in which the air deflection plug-in unit is inserted, that is, the slot space can receive all airflows generated by the fan group, thereby ensuring the total air intake volume. In addition, all the airflows received by the slot space can be used to dissipate heat for the line card on the service carrier board, thereby resolving the problem of airflow overflow, and ensuring the heat dissipation effect. In addition, since the air deflection plug-in unit no longer blocks airflows, noise generated due to airflow impact is also reduced.

In an exemplary embodiment, the fan group includes a plurality of fans, and the fans are sequentially arranged side by side in a stacking direction of the slots. In this design, the fan group can evenly generate airflows for the slots, which avoids uneven airflows, thereby ensuring that the slots can have plenty of airflows.

According to a third aspect, an electronic device is further provided, including a cabinet and an electronic component. The cabinet is the cabinet according to the first aspect, and has all beneficial effects of the cabinet according to the first aspect. The electronic device includes a line card and a switch fabric unit. The line card is mounted on the service carrier board to be inserted into the slot together with the service carrier board. In this way, heat in the line card can be well dissipated by the cabinet. The switch fabric unit is directly mounted in the cabinet and is located between the slot space and the fan group, so that an airflow flowing out of the slot space can further flow through the switch fabric unit, and after dissipating heat for the switch fabric unit, the airflow is guided out of the fan group to exchange heat with the outside.

The electronic device provided in embodiments of this disclosure has at least the following effects.

The cabinet is configured to carry the electronic component to provide a mounting basis and a heat dissipation condition for the electronic component. Since the line card of the electronic device is mounted on the service carrier board, and the service carrier board is located in the slot, an airflow flowing in the slot can dissipate heat well for the line card. In this way, the line card is in an appropriate working temperature, thereby ensuring normal operation of the line card. Since the switch fabric unit of the electronic device is mounted in the cabinet and is located between the slot space and the fan group, an airflow flowing out of the slot space can further dissipate heat well for the switch fabric unit. In this way, the switch fabric unit is in an appropriate working temperature, thereby ensuring normal operation of the switch fabric unit. In other words, the electronic device provided in embodiments of this disclosure can ensure good heat dissipation of the electronic device, thereby ensuring normal and stable operation of the electronic device.

According to a fourth aspect, a manufacturing method for a cabinet is further provided, including the following steps. First, a cabinet body is provided. The cabinet body is provided with a slot space, and the slot space is divided into a plurality of slots stacked in sequence and that are in communication with each other, so as to provide a mounting basis for mounting a fan group, an air deflection plug-in unit, and a service carrier board in subsequent steps. Then, the fan group is connected to the cabinet body, so that the fan group and the slot space are arranged side by side, and airflows flowing through the slot space can be generated through the fan group. Further, the air deflection plug-in unit is detachably inserted into the slot, so that an airflow in the slot in which the air deflection plug-in unit is located can be guided to adjacent slot through the air deflection plug-in unit.

Finally, the service carrier board is detachably inserted into the slot, so that a line card can be carried through the service carrier board.

The manufacturing method for a cabinet provided in embodiments of this disclosure has at least the following effects.

When an electronic component such as a line card is accommodated in the cabinet manufactured by performing the manufacturing method provided in embodiments of this disclosure, the fan group operates to form airflows that flow through the slot space. Some airflows flow through a slot in which the service carrier board is inserted, to directly dissipate heat for the line card mounted on the service carrier board. Some other airflows flow through a slot in which the air deflection plug-in unit is inserted. Since the air deflection plug-in unit can guide airflows in the slot in which the air deflection plug-in unit is located to an adjacent slot, the airflows are finally guided to the slot in which the service carrier board is inserted, which can also dissipate heat for the line card mounted on the service carrier board. As can be seen from the above, air can enter both the slot in which the service carrier board is inserted and the slot in which the air deflection plug-in unit is inserted, that is, the slot space can receive all airflows generated by the fan group, thereby ensuring the total air intake volume. In addition, all the airflows received by the slot space can be used to dissipate heat for the line card on the service carrier board, thereby resolving the problem of airflow overflow, and ensuring the heat dissipation effect. In addition, since the air deflection plug-in unit no longer blocks airflows, noise generated due to airflow impact is also reduced.

Figure 1:
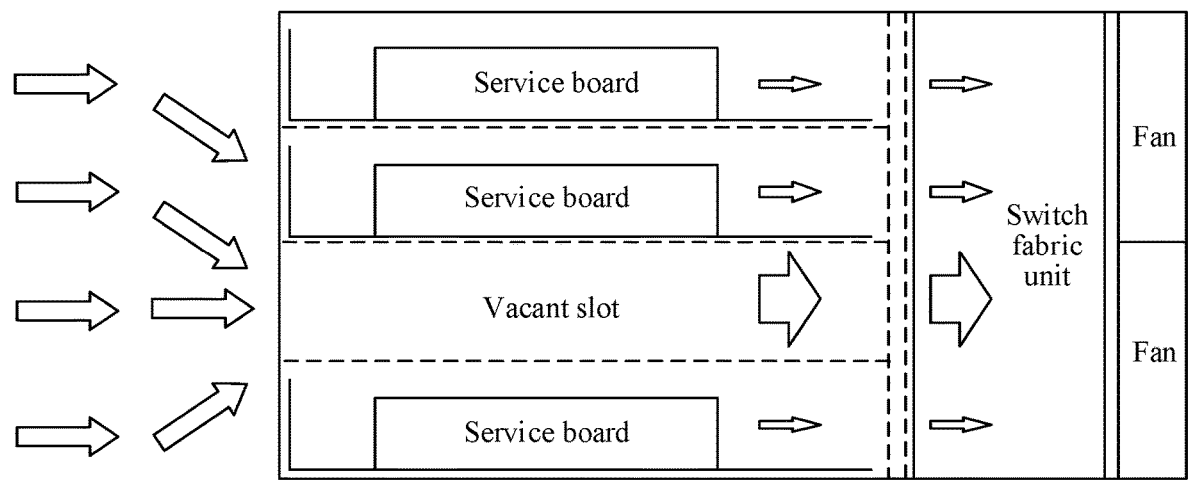
FIG. 1 is a schematic diagram of a structure of a cabinet in a related technology.

Descriptions of reference numerals are as follows.

1. Housing;

1a. First air intake vent;

1b. First air exhaust vent;
1c. Second air intake vent;
1d. Third air intake vent;
1e. Second air exhaust vent;
11. Upper cover plate;
12. Lower cover plate;
13. End plate;
14. Protective net;
2. Flow guiding structure;
21. First air deflector;
22. Second air deflector;
A. First space;
B. Second space;
C. Third space;
10. Cabinet body;
101. Slot space;
1011. Slot;
20. Fan group;
201. Fan;
30. Air deflection plug-in unit;
40. Service carrier board;
100. Cabinet;
200. Electronic component;
210. Line card; and
220. Switch fabric unit.

DESCRIPTION OF EMBODIMENTS

Terms used in implementations of this disclosure are merely used to explain embodiments of this disclosure, and are not intended to limit this disclosure.

A data center switch is an important part of a data center, and mainly includes a main control card, a line card, and a switch fabric unit. The main control card functions as the brain of a switch and performs a control function. The line card mainly provides various ports of different rates, and the switch fabric unit provides high-speed interconnection between line cards.

Figure 2:
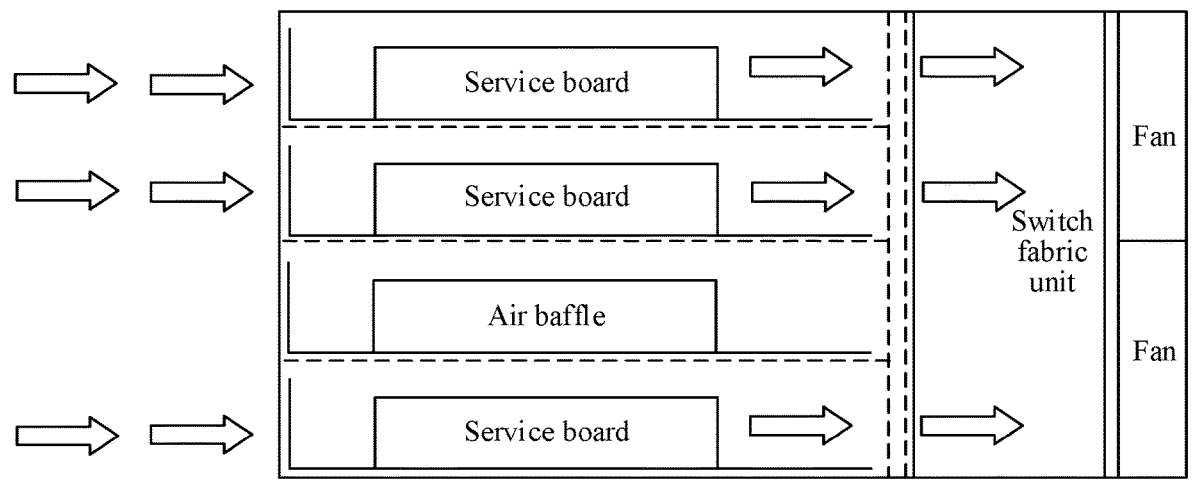
FIG. 2 is a schematic diagram of a structure of a cabinet in which an air baffle is inserted in a related technology.

In a related technology, a cabinet is usually used to carry a switch. The cabinet mainly includes a cabinet body, a fan group, and a plurality of service carrier boards. The service carrier board is configured to carry the line card. The cabinet body is provided with a plurality of slots capable of accommodating the service carrier boards, and the slots are sequentially stacked from top to bottom and are in communication with each other. The fan group is located on side of the slots, to guide an airflow to flow through the slot and dissipate heat for the line card inserted in the slot. Refer to FIG. 1. In actual application, the slots are usually vacant (in which no service carrier board is inserted). The vacant slots provide bypasses for airflows, so that the airflows overflow from the vacant slots. As a result, an air volume of a slot in which the service carrier board is inserted decreases, and the line card cannot achieve a good heat dissipation effect. To resolve such a problem, air baffles are usually inserted into the vacant slots to block airflows, thereby reducing airflow bypasses (refer to FIG. 2).

However, since some airflows are blocked by the air baffles, only some slots can be used for air intake, which reduces a total air intake volume, affecting the heat dissipation effect of the cabinet.

Figure 3:
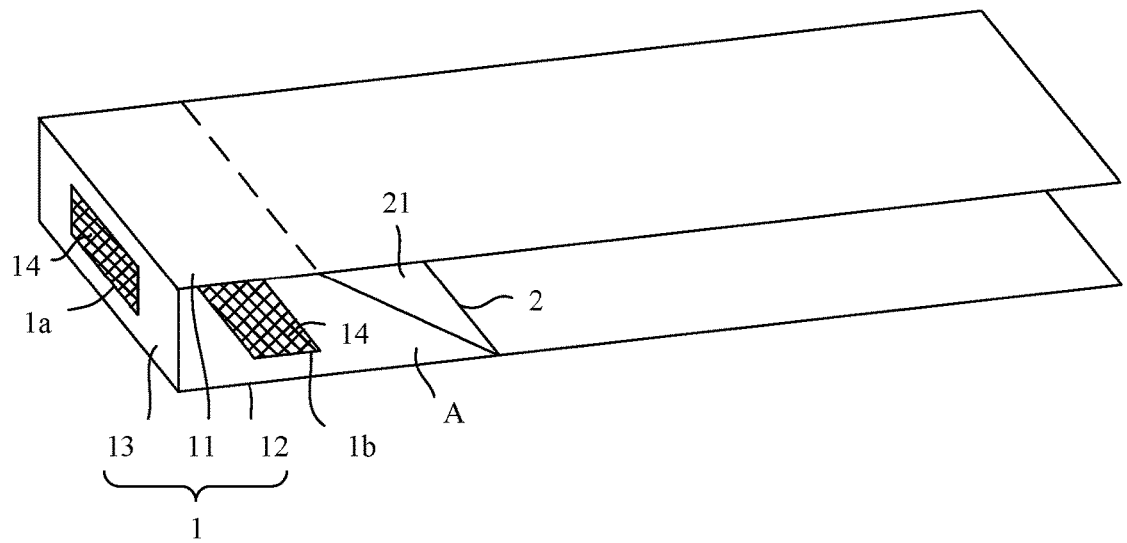
FIG. 3 is a schematic diagram of a structure of an air deflection plug-in unit according to an embodiment of this disclosure.

To resolve such a technical problem, embodiments of this disclosure provide an air deflection plug-in unit. FIG. 3 is a schematic diagram of a structure of the air deflection plug-in unit. The air deflection plug-in unit includes a housing 1 and a flow guiding structure 2. The housing 1 is provided with a first air intake vent 1a and a first air exhaust vent 1b. There is an included angle between planes on which the first air intake vent 1a and the first air exhaust vent 1b are located. The flow guiding structure 2 is located in the housing 1, and the flow guiding structure 2 is configured to guide an airflow flowing into the first air intake vent 1a to the first air exhaust vent 1b.

Since there is an included angle between the planes on which the first air intake vent 1a and the first air exhaust vent 1b are located, overflowing directions of the first air intake vent 1a and the first air exhaust vent 1b are different, that is, directions of airflows flowing through the first air intake vent 1a and the first air exhaust vent 1b are different from each other. In this way, direction change and guiding of the airflow can be implemented. In addition, since the flow guiding structure 2 can guide the airflow flowing into the first air intake vent 1a to the first air exhaust vent 1b, direction change and guiding of the airflow can be implemented through the air deflection plug-in unit.

Figure 4:
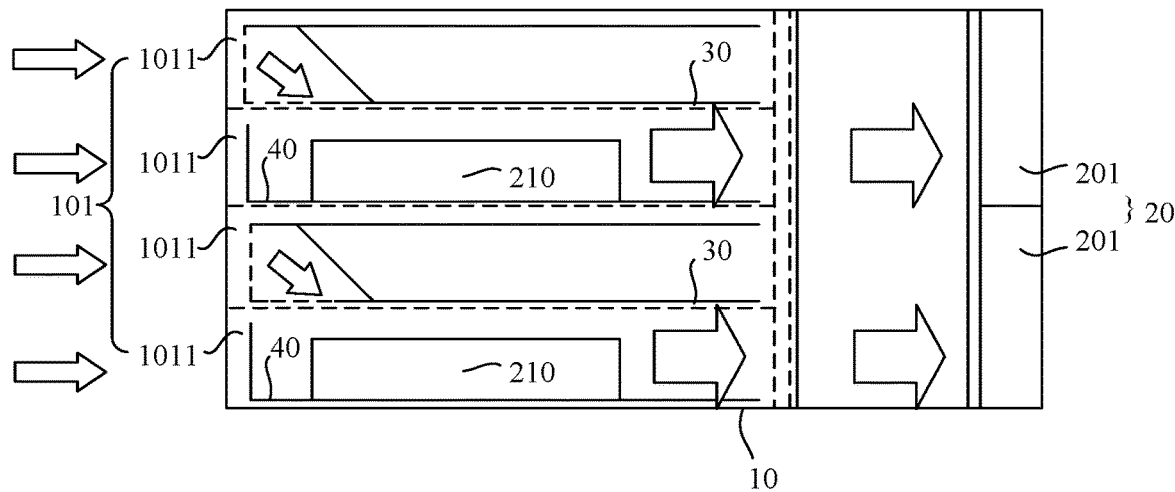
FIG. 4 is a schematic diagram of a structure of a cabinet according to an embodiment of this disclosure.

The air deflection plug-in unit is applied to a cabinet. FIG. 4 is a schematic diagram of a structure of a cabinet according to an embodiment of this disclosure. The air deflection plug-in unit shown in FIG. 3 is arranged in the cabinet. For ease of understanding an orientation of each component in an air deflection plug-in unit 30 in the cabinet, it is particularly noted that an overall orientation in FIG. 4 is the same as that in FIG. 3. To be specific, a fan group 20 is located on a right side of the air deflection plug-in unit 30 in FIG. 3, and airflows flow from left to right in FIG. 3.

Refer to FIG. 4. In this embodiment, the cabinet includes a cabinet body 10, a fan group 20, an air deflection plug-in unit 30, and a service carrier board 40.

A slot space 101 is provided in the cabinet body 10. The slot space 101 is formed by a plurality of slots 1011 that are stacked in sequence and are in communication with each other, and each of the slots 1011 is configured to accommodate the air deflection plug-in unit 30 or the service carrier board 40. In other words, as a main body of the cabinet, the cabinet body 10 can provide a mounting basis for the air deflection plug-in unit 30 and the service carrier board 40. In addition, the slot space 101 in the cabinet body 10 is divided into a plurality of slots 1011 that are in communication with each other. One air deflection plug-in unit 30 or one service carrier board 40 is inserted into each slot 1011, which may not only provide a space basis for an airflow to flow through each slot 1011, but also provide a relatively independent area for the air deflection plug-in unit 30 and the service carrier board 40, thereby avoiding mutual interference between the air deflection plug-in unit 30 and the service carrier board 40 during assembly.

The fan group 20 is located in the cabinet body 10. The fan group 20 and the slot space 101 are arranged side by side to form airflows flowing through the slot space 101. To form a stable air duct, an airflow direction is from the slot space 101 to the fan group 20, that is, in FIG. 4, airflows flow from left to right. In this way, when flowing through the slot space 101, the airflows can take away heat in the slot space 101 from the right side, to implement air cooling and heat dissipation.

The air deflection plug-in unit 30 is detachably inserted into the slot 1011 to guide an airflow in the slot 1011 in which the air deflection plug-in unit 30 is located to an adjacent slot 1011. The service carrier board 40 is detachably inserted into the slot 1011 to carry a line card 210. The air deflection plug-in unit 30 and the service carrier board 40 are detachably inserted into slots 1011, so that a user can determine, according to an actual requirement, whether the air deflection plug-in unit 30 or the service carrier board 40 is inserted into the slot 1011. For example, if a quantity of line cards 210 that to be carried is relatively large, service carrier boards 40 are inserted into a large number of slots 1011 of a corresponding quantity, and air deflection plug-in units 30 are inserted into remaining vacant slots 1011, to guide airflows in the vacant slots 1011 to other slots 1011. If a quantity of line cards 210 that to be carried is relatively small, service carrier boards 40 are inserted into a small number of slots 1011 of a corresponding quantity, and air deflection plug-in units 30 are inserted into remaining vacant slots 1011, to guide airflows in the vacant slots 1011 to other slots 1011.

When an electronic component such as a line card 210 is accommodated in the cabinet provided in embodiments of this disclosure, the fan group 20 operates to form airflows that flow through the slot space 101. Some airflows flow through a slot 1011 in which the service carrier board 40 is inserted, to directly dissipate heat for the line card 210 mounted on the service carrier board 40. Some other airflows flow through a slot 1011 in which the air deflection plug-in unit 30 is inserted. Since the air deflection plug-in unit 30 can guide airflows in the slot 1011 in which the air deflection plug-in unit is located to an adjacent slot 1011, the airflows are finally guided to the slot 1011 in which the service carrier board 40 is inserted, which can also dissipate heat for the line card 210 mounted on the service carrier board 40. As can be seen from the above, air can enter both the slot 1011 in which the service carrier board 40 is inserted and the slot 1011 in which the air deflection plug-in unit 30 is inserted, that is, the slot space 101 can receive all airflows generated by the fan group 20, thereby ensuring the total air intake volume. In addition, all the airflows received by the slot space 101 can be used to dissipate heat for the line card 210 on the service carrier board 40, thereby resolving the problem of airflow overflow, and ensuring the heat dissipation effect. In addition, since the air deflection plug-in unit 30 no longer blocks airflows, noise generated due to airflow impact is also reduced.

In an exemplary embodiment, the fan group 20 includes a plurality of fans 201, and the fans 201 are sequentially arranged side by side in a stacking direction of the slots 1011. In this design, the fan group 20 can evenly generate airflows for the slots 1011, to avoid uneven airflows, thereby ensuring that the slots 1011 can have plenty of airflows.

It is to be noted that, although FIG. 4 shows that one fan 201 corresponds to two slots 1011, in an actual situation, a quantity of fans 201 corresponds to a quantity of slots 1011. This can be adjusted according to a requirement. For example, one fan 201 corresponds to one slot 1011, or one fan 201 corresponds to three slots 1011. This is not limited in this disclosure.

As can be seen from the above, the air deflection plug-in unit 30 is a key component that makes full use of the airflow in the slot 1011 to improve the heat dissipation effect. The air deflection plug-in unit 30 is further described below.

Refer to FIG. 3 again. In this embodiment, the housing includes an upper cover plate 11, a lower cover plate 12, and an end plate 13. The upper cover plate 11 and the lower cover plate 12 are opposite to each other. The end plate 13 is located between the upper cover plate 11 and the lower cover plate 12. One side edge of the end plate 13 is connected to one side edge of the upper cover plate 11 away from the fan group 20, and the other side edge of the end plate 13 is connected to one side edge of the lower cover plate 12 away from the fan group 20. The flow guiding structure includes a first air deflector, and the first air deflector 21 is located between the upper cover plate 11 and the lower cover plate 12. One side edge of the first air deflector 21 is connected to the upper cover plate 11, and the other opposite side edge of the first air deflector 21 is connected to the lower cover plate 12.

In an exemplary embodiment, the upper cover plate 11 is a rectangular plate, and extends in a direction from the slot space to the fan group 20. The lower cover plate 12 is parallel to the upper cover plate 11. A shape and a size of the lower cover plate 12 are the same as those of the upper cover plate 11. An orthographic projection of the lower cover plate 12 on the upper cover plate 11 completely overlaps the upper cover plate 11. The end plate 13 is a rectangular plate. The end plate 13 is respectively perpendicular to the upper cover plate 11 and the lower cover plate 12. The end plate 13, the upper cover plate 11, and the lower cover plate 12 are welded together, so as to ensure connection firmness of the end plate 13 between the upper cover plate 11 and the lower cover plate 12. The first air deflector 21 is a rectangular plate. The first air deflector 21, the upper cover plate 11, and the lower cover plate 12 are welded together, so as to ensure connection firmness of the first air deflector 21 between the upper cover plate 11 and the lower cover plate 12.

The upper cover plate 11, the lower cover plate 12, the end plate 13, and the first air deflector 21 enclose a first space A. The first air intake vent 1a is located at a position corresponding to the end plate 13 in the first space A, and the first air intake vent 1a is in communication with the outside. The first air exhaust vent 1b is located at a position corresponding to the lower cover plate 12 in the first space A, and the first air exhaust vent 1b is opposite to a lower adjacent slot 1011.

The end plate 13 is arranged between the upper cover plate 11 and the lower cover plate 12, and two side edges of the end plate 13 are respectively connected to the upper cover plate 11 and the lower cover plate 12, so that the upper cover plate 11 and the lower cover plate 12 can be connected as a whole by using the end plate 13. The first air deflector 21 is arranged between the upper cover plate 11 and the lower cover plate 12, so that the first space A can be enclosed between the upper cover plate 11, the lower cover plate 12, and the end plate 13 by using the first air deflector 21, to provide a space basis for airflow guiding. Further, the first air exhaust vent 1b and the first air intake vent 1a are provided in the first space A. The first air intake vent 1a is located at the position corresponding to the end plate 13 in the first space A, so that the first space A is in communication with the outside; and the first air exhaust vent 1b is located the position corresponding to the lower cover plate 12 in the first space A, so that the first space A is opposite to the lower adjacent slot 1011, thereby defining a path for airflows to enter the first space A and a path for the airflows to flow out of the first space A.

Figure 5:
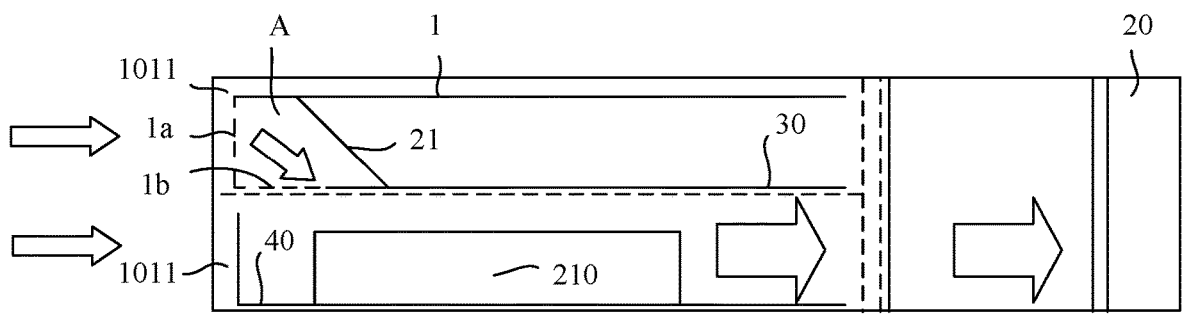
FIG. 5 is a diagram of an airflow direction in an air deflection plug-in unit according to an embodiment of this disclosure.

FIG. 5 is a diagram of an airflow direction in an air deflection plug-in unit 30. To show an air guide situation between adjacent slots 1011 more clearly, FIG. 5 shows only two slots 1011 and omits other slots 1011. With reference to FIG. 5, the following describes a flow guide principle of the air deflection plug-in unit 30.

The fan group 20 operates to form flowing airflows on two sides of the slot space 101. The service carrier board 40 is located below the air deflection plug-in unit 30.

For the slot 1011 in which the service carrier board 40 is inserted, normal-temperature airflows directly flow into the slot 1011 from a left side and flow through the service carrier board 40. When flowing through the service carrier board 40, the airflows exchange heat with the line card 210 on the service carrier board 40, and are converted into high-temperature airflows and flow out from a right side of the slot 1011, thereby completing an entire heat dissipation process.

For the slot 1011 in which the air deflection plug-in unit 30 is inserted, normal-temperature airflows flow into the first space A through the first air intake vent 1a and flow out of the first space A through the first air exhaust vent 1b, to flow into a lower slot 1011 and converge with an airflow in the lower slot 1011, thereby further increasing an airflow volume in the lower slot 1011, and improving the heat dissipation effect of the line card 210.

In addition, to ensure that the airflow flowing through the first air exhaust vent 1b can smoothly converge with the airflow flowing from the left side of the slot 1011, the first air exhaust vent 1b is provided close to the end plate 13.

Further, the first air deflector 21 is inclined from one side edge to the other opposite side edge in a direction away from the first air exhaust vent 1b. In this design, the first air deflector 21 can better guide an airflow entering the first space A, so that the airflow can flow along the inclined first air deflector 21 toward the first air exhaust vent 1b, thereby smoothly flowing into the lower slot 1011.

In addition, the first air deflector 21 that is arranged in an inclined manner can further reduce airflow impact on the first air deflector 21, thereby achieving an objective of noise reduction.

Figure 6:
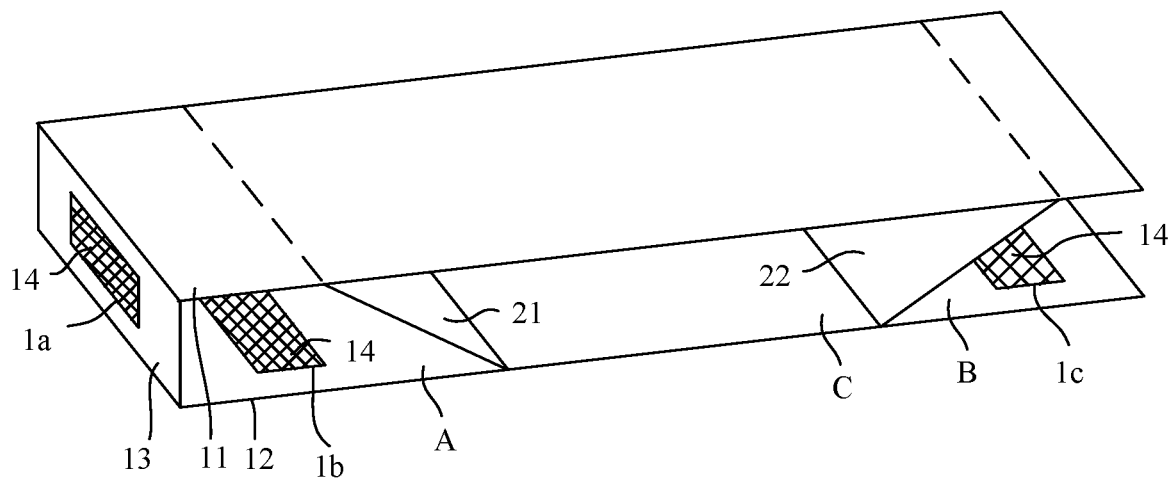
FIG. 6 is a schematic diagram of a structure of another air deflection plug-in unit according to an embodiment of this disclosure.

FIG. 6 is a schematic diagram of a structure of another air deflection plug-in unit 30 according to an embodiment of this disclosure. Since the figure is only a schematic diagram of a structure of the air deflection plug-in unit 30, other components of the cabinet are not shown. For ease of understanding an orientation of each component in an air deflection plug-in unit 30 in the cabinet, it is particularly noted that an overall orientation in FIG. 6 is the same as that in FIG. 4. To be specific, a fan group 20 is located on a right side of the air deflection plug-in unit 30 in FIG. 6, and airflows flow from left to right in FIG. 6.

The structure of the air deflection plug-in unit 30 shown in FIG. 6 is substantially the same as the structure of the air deflection plug-in unit 30 shown in FIG. 3. The air deflection plug-in unit 30 shown in FIG. 6 has all beneficial effects of the air deflection plug-in unit 30 shown in FIG. 3. A difference lies in that, the flow guiding structure further includes a second air deflector 22, the second air deflector 22 is located on one side of the first air deflector 21 away from the end plate 13 and is located between the upper cover plate 11 and the lower cover plate 12, one side edge of the second air deflector 22 is connected to the upper cover plate 11, and the other opposite side edge of the second air deflector 22 is connected to the lower cover plate 12.

In an exemplary embodiment, the second air deflector 22 is a rectangular plate. The second air deflector 22, the upper cover plate 11, and the lower cover plate 12 are welded together, so as to ensure connection firmness of the second air deflector 22 between the upper cover plate 11 and the lower cover plate 12.

The upper cover plate 11, the lower cover plate 12, and one side of the second air deflector 22 away from the first air deflector 21 enclose a second space B. A side of the second space B facing the fan group 20 is provided with an opening, and the opening is a gap between the upper cover plate 11 and the lower cover plate 12. A second air intake vent 1c is provided at a position corresponding to the lower cover plate 12 in the second space B, and the second air intake vent 1c is opposite to the lower adjacent slot 1011.

The second air deflector 22 is arranged between the upper cover plate 11 and the lower cover plate 12, so that the second space B can be enclosed between the upper cover plate 11 and the lower cover plate 12 by using the second air deflector 22, to provide a space basis for airflow guiding. Further, the second air intake vent 1c is provided in the second space B, and the second air intake vent 1c is located at the position corresponding to the lower cover plate 12 in the second space B, so that the second space B is in communication with the lower adjacent slot 1011, to define a path for an airflow to enter the second space B.

Figure 7:
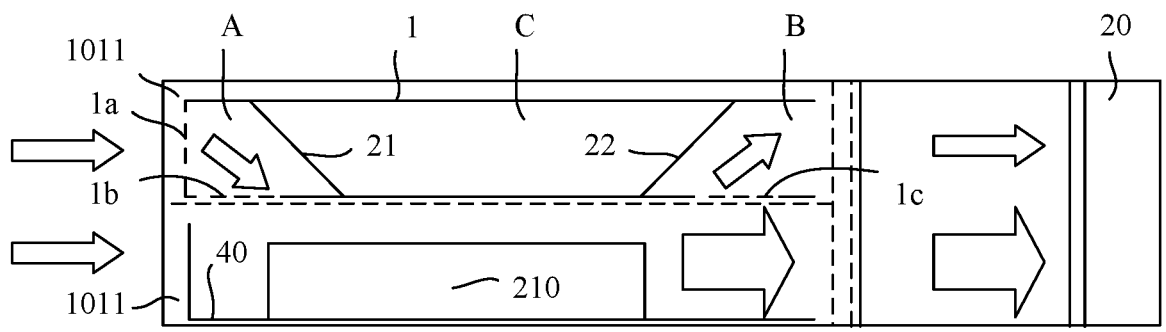
FIG. 7 is a diagram of an airflow direction in an air deflection plug-in unit according to an embodiment of this disclosure.

FIG. 7 is a diagram of an airflow direction in an air deflection plug-in unit 30. To show an air guide situation between adjacent slots 1011 more clearly, FIG. 7 shows only two slots 1011 and omits other slots 1011. With reference to FIG. 7, the following describes a flow guide principle of the air deflection plug-in unit 30.

The fan group 20 operates to form flowing airflows on two sides of the slot space 101. The service carrier board 40 is located below the air deflection plug-in unit 30.

For the slot 1011 in which the service carrier board 40 is inserted, normal-temperature airflows directly flow into the slot 1011 from a left side and flow through the service carrier board 40. When flowing through the service carrier board 40, the airflows exchange heat with the line card 210 on the service carrier board 40, and are converted into high-temperature airflows. Some airflows flow out of the slot 1011 from the right side. Some other airflows flow upward and flow into the corresponding second space B through the second air intake vent 1c on an upper slot 1011, and finally flow out through an opening on one side of the second space B facing the fan group 20. In other words, airflows can flow out not only from the slot 1011 in which the service carrier board 40 is inserted, but also from the slot 1011 in which the air deflection plug-in unit 30 is inserted, thereby improving air exhaust uniformity of the slot space 101. In addition, heat dissipation of other electronic components in the cabinet can be effectively prevented from being affected by an air-free area on a right side of the air deflection plug-in unit 30, that is, a side close to the fan group 20.

For the slot 1011 in which the air deflection plug-in unit 30 is inserted, normal-temperature airflows flow into the first space A through the first air intake vent 1a and flow out of the first space A through the first air exhaust vent 1b, to flow into the lower slot 1011 and converge with an airflow in a lower slot 1011, thereby further increasing an airflow volume in the lower slot 1011, and improving the heat dissipation effect of the line card 210.

In addition, to prevent airflows flowing out through the second air intake vent 1c from the service carrier board 40 from affecting the heat dissipation effect of the service carrier board 40, the second air intake vent 1c is provided close to the fan group 20. In this way, it can be ensured that an airflow flows into an upper air deflection plug-in unit 30 through the second air intake vent 1c only after the airflow fully dissipates heat for the line card 210 on the service carrier board 40.

Further, the second air deflector 22 is inclined from one side edge to the other opposite side edge in a direction away from the second air intake vent 1c. In this design, the second air deflector 22 can better guide an airflow entering the second space B, so that the airflow can flow out, along the inclined second air deflector 22, through the opening on one side of the second space B facing the fan group 20.

In addition, the second air deflector 22 that is arranged in an inclined manner can further reduce airflow impact on the second air deflector 22, thereby achieving an objective of noise reduction.

In an actual situation, there are usually a plurality of continuously stacked vacant slots 1011, and an air deflection plug-in unit 30 is inserted into each vacant slot 1011. To ensure that the air deflection plug-in unit 30 in the vacant slot 1011 may not only guide an airflow to the lower service carrier board 40, which is described above, but also guide the airflow back from the lower service carrier board 40, and further continuously guide air to the lower air deflection plug-in unit 30. Embodiments of this disclosure provide another air deflection plug-in unit 30.

Figure 8:
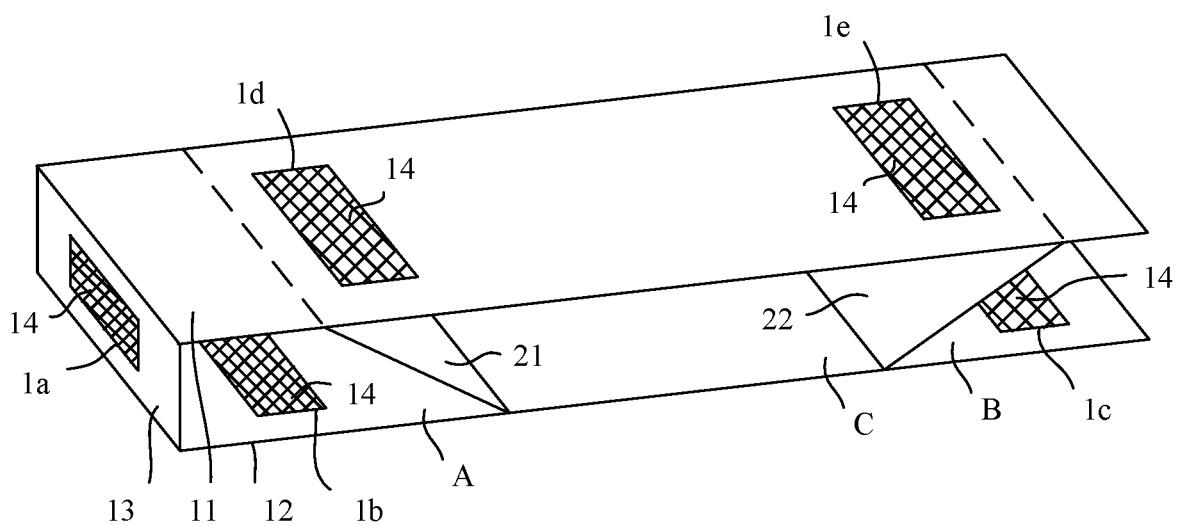
FIG. 8 is a schematic diagram of a structure of still another air deflection plug-in unit according to an embodiment of this disclosure.

FIG. 8 is a schematic diagram of a structure of still another air deflection plug-in unit 30 according to an embodiment of this disclosure. Since the figure is only a schematic diagram of a structure of the air deflection plug-in unit 30, other components of the cabinet are not shown. For ease of understanding an orientation of each component in an air deflection plug-in unit 30 in the cabinet, it is particularly noted that an overall orientation in FIG. 8 is the same as that in FIG. 4. To be specific, a fan group 20 is located on a right side of the air deflection plug-in unit 30 in FIG. 8, and airflows flow from left to right in FIG. 8.

The structure of the air deflection plug-in unit 30 shown in FIG. 8 is substantially the same as the structure of the air deflection plug-in unit 30 shown in FIG. 6. The air deflection plug-in unit 30 shown in FIG. 8 has all beneficial effects of the air deflection plug-in unit 30 shown in FIG. 6. A difference lies in that, the upper cover plate 11, the lower cover plate 12, the first air deflector 21, and the second air deflector 22 enclose a third space C, and a third air intake vent 1*d* and a second air exhaust vent 1*e* are respectively provided at positions corresponding to the upper cover plate 11 in the third space C. The third air intake vent 1*d* and the second air exhaust vent 1*e* are spaced from each other. The third air intake vent 1*d* is opposite to the first air exhaust vent 1*b* on an upper adjacent slot 1011, and the second air exhaust vent 1*e* is opposite to the second air intake vent 1*c* on the upper adjacent slot 1011.

The third space C is enclosed between the upper cover plate 11 and the lower cover plate 12 by using the second air deflector 22 and the first air deflector 21, to provide a space basis for airflow guiding. Further, the third air intake vent 1*d* and the second air exhaust vent 1*e* are provided in the third space C, and the third air intake vent 1*d* and the second air exhaust vent 1*e* are located at the positions corresponding to the upper cover plate 11 in the third space C. The third air intake vent 1*d* is opposite to the first air exhaust vent 1*b* on the upper adjacent slot 1011, and the second air exhaust vent 1*e* is opposite to the second air intake vent 1*c* on the upper adjacent slot 1011. In this way, the third space C can be respectively in communication with the first space A and the second space B in the upper adjacent slot 1011, thereby defining a path for airflows to enter the third space C and a path for the airflows to flow out of the third space C.

In an exemplary embodiment, the third air intake vent 1*d* is opposite to a part of the first air exhaust vent 1*b* on the upper adjacent slot 1011, and the second air exhaust vent 1*e* is opposite to the second air intake vent 1*c* on the upper adjacent slot 1011. In other words, the third air intake vent 1*d* is inclined toward the second air intake vent 1*c* opposite to a position right below the first air exhaust vent 1*b*, and the second air exhaust vent 1*e* is inclined toward the first air exhaust vent 1*b* opposite to a position right below the second air intake vent 1*c*.

Figure 9:
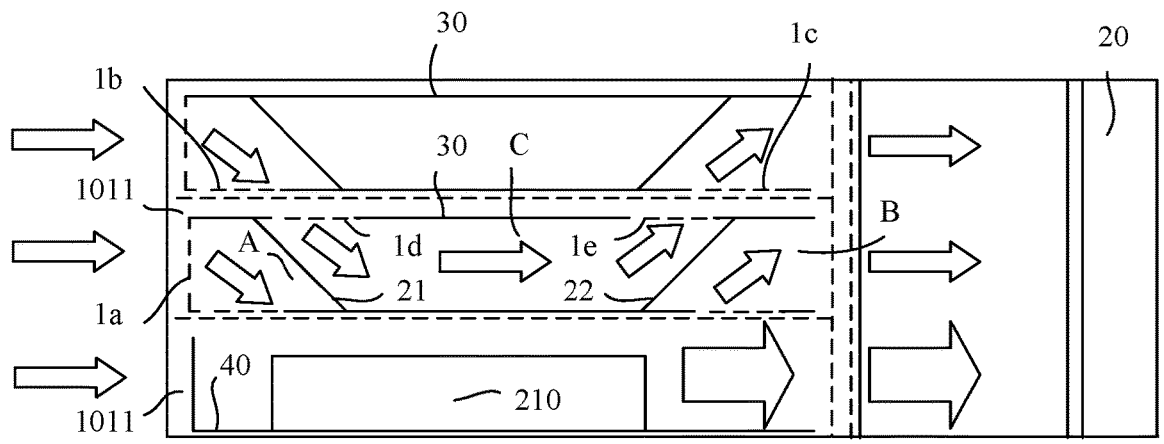
FIG. 9 is a diagram of an airflow direction in an air deflection plug-in unit according to an embodiment of this disclosure.

FIG. 9 is a diagram of an airflow direction in an air deflection plug-in unit 30. To show an air guide situation between adjacent slots 1011 more clearly, FIG. 9 shows only three slots 1011 and omits other slots 1011. With reference to FIG. 9, the following describes a flow guide principle of the air deflection plug-in unit 30.

The fan group 20 operates to form flowing airflows on two sides of the slot space 101. The first air deflection plug-in unit 30, the second air deflection plug-in unit 30, and the service carrier board 40 are sequentially stacked from top to bottom, that is, two air deflection plug-in units 30 are continuously stacked together.

For the slot 1011 in which the first air deflection plug-in unit 30 is inserted, normal-temperature airflows enter the first space A through the first air intake vent 1*a*, flow out of the first space A through the first air exhaust vent 1*b*, and further enter a corresponding third space C through the third air intake vent 1*d* of the second air deflection plug-in unit 30, Airflows in the third space C flow out of the third space C through the second air exhaust vent 1*e*, enter a corresponding second space B through the first air intake vent 1*c* of the first air deflection plug-in unit 30, and finally flow out through an opening on one side of the second space B facing the fan group 20. That is, when the air deflection plug-in units 30 are inserted into two adjacent slots 1011, an airflow entering the air deflection plug-in unit 30 in the upper slot 1011 can flow by using the third space C of the air deflection plug-in unit 30 in the lower slot 1011, and finally returns to the air deflection plug-in unit 30 in the upper slot 1011 and flows out of the slot space 101, thereby further improving the air exhaust uniformity of the slot space 101. In addition, heat dissipation of other electronic components in the cabinet can be effectively prevented from being affected by an air-free area on a right side of the air deflection plug-in unit 30, that is, a side close to the fan group 20.

For the slot 1011 in which the second air deflection plug-in unit 30 is inserted, normal-temperature airflows flow into the first space A through the first air intake vent 1*a* and flow out of the first space A through the first air exhaust vent 1*b*, to flow into the lower slot 1011 and converge with an airflow in a lower slot 1011, thereby further increasing an airflow volume in the lower slot 1011, and improving the heat dissipation effect of the line card 210.

For the slot 1011 in which the service carrier board 40 is inserted, normal-temperature airflows directly flow into the slot 1011 from a left side and flow through the service carrier board 40. When flowing through the service carrier board 40, the airflows exchange heat with the line card 210 on the service carrier board 40, and are converted into high-temperature airflows. Some airflows flow out of the slot 1011 from the right side. Some other airflows flow upward and flow into the corresponding second space B through the second air intake vent 1*c* of the second air deflection plug-in unit 30, and finally flow out through an opening on one side of the second space B facing the fan group 20. In other words, airflows can flow out not only from the slot 1011 in which the service carrier board 40 is inserted, but also from the slot 1011 in which the air deflection plug-in unit 30 is inserted, thereby improving air exhaust uniformity of the slot space 101. In addition, heat dissipation of other electronic components in the cabinet can be effectively prevented from being affected by an air-free area on a right side of the air deflection plug-in unit 30, that is, a side close to the fan group 20.

In an exemplary embodiment, the third air intake vent 1*d* and the second air exhaust vent 1*e* can be communicated together to form a relatively large air vent. The air vent is opposite to both the first air exhaust vent 1*b* and the second air intake vent 1*c* on the upper adjacent slot 1011. In this case, since there is no spacing between the third air intake vent 1*d* and the second air exhaust vent 1*e*, the air deflection plug-in unit 30 in the upper adjacent slot 1011 is used as an isolation means, that is, the spacing between the first air exhaust vent 1b and the second air intake vent 1c in the upper adjacent slot 1011 is used. In this case, costs of materials can be reduced, which is conducive to cost control.

In an exemplary embodiment, the first air intake vent 1a, the second air intake vent 1c, the third air intake vent 1d, the first air exhaust vent 1b, and the second air exhaust vent 1e have protective nets 14. In this design, a foreign matter can be prevented from directly entering the air deflection plug-in unit 30, which not only prevents the foreign matter from blocking the air deflection plug-in unit 30, but also prevents the foreign matter from entering the service carrier board 40 along with an airflow and affecting the line card 210 in the service carrier board 40.

It is easy to be understood that, to reduce costs, in an exemplary embodiment, the protective net 14 is arranged only on the first air intake vent 1a.

Exemplarily, indicators such as an aperture and a mesh size in the protective net 14 are adjusted according to an actual requirement. If heat dissipation performance has a higher priority, the aperture of the protective net 14 is properly designed to be relatively large, and the mesh size is properly designed to be relatively small. If the dust-proof performance has a higher priority, the aperture of the protective net 14 is properly designed to be small, and the mesh size is properly designed to be large. This is not limited in this disclosure.

In an exemplary embodiment, the cabinet includes a plurality of replaceable air deflection plug-in units 30. A first air intake vent 1a, a second air intake vent 1c, a third air intake vent 1d, a first air exhaust vent 1b, and a second air exhaust vent 1e of each of the air deflection plug-in units 30 have various sizes.

In other words, a plurality of air deflection plug-in units 30 of a same structure but with different sizes of air vent (the first air intake vent 1a, the second air intake vent 1c, the third air intake vent 1d, the first air exhaust vent 1b, and the second air exhaust vent 1e) can be prepared. In this design, a user can select an air deflection plug-in unit 30 of an appropriate size according to an actual requirement, so as to control an amount and a flow rate of airflows, thereby improving applicability of the cabinet.

For example, if an air intake volume of the air deflection plug-in unit 30 needs to be increased, an air deflection plug-in unit 30 with a larger size of the first air intake vent 1a is correspondingly selected. If an air exhaust volume of the air deflection plug-in unit 30 needs to be increased, an air deflection plug-in unit 30 with a larger size of the second air intake vent 1c is correspondingly selected.

The following briefly describes an assembly procedure of the cabinet provided in embodiments of this disclosure.

First, the fans 201 are sequentially mounted in the cabinet body 10 from bottom to top, so that the fans 201 are located on one side of the slot space 101, that is, on the right side in FIG. 4.

Then, the service carrier board 40 is selected. A quantity of service carrier boards 40 is selected according to a quantity of line cards 210, and sizes of air vents (the first air intake vent 1a, the second air intake vent 1c, the third air intake vent 1d, the first air exhaust vent 1b, and the second air exhaust vent 1e) of the service carrier boards 40 are selected according to heat dissipation requirements.

Then, the service carrier board 40 is inserted into a vacant slot 1011. To ensure a heat dissipation effect of each of the service carrier boards 40, the service carrier boards 40 are evenly spaced in the slot space 101, so as to avoid excessive concentration of the service carrier boards 40.

Finally, the air deflection plug-in units 30 are inserted into remaining vacant slots 1011.

Figure 10:
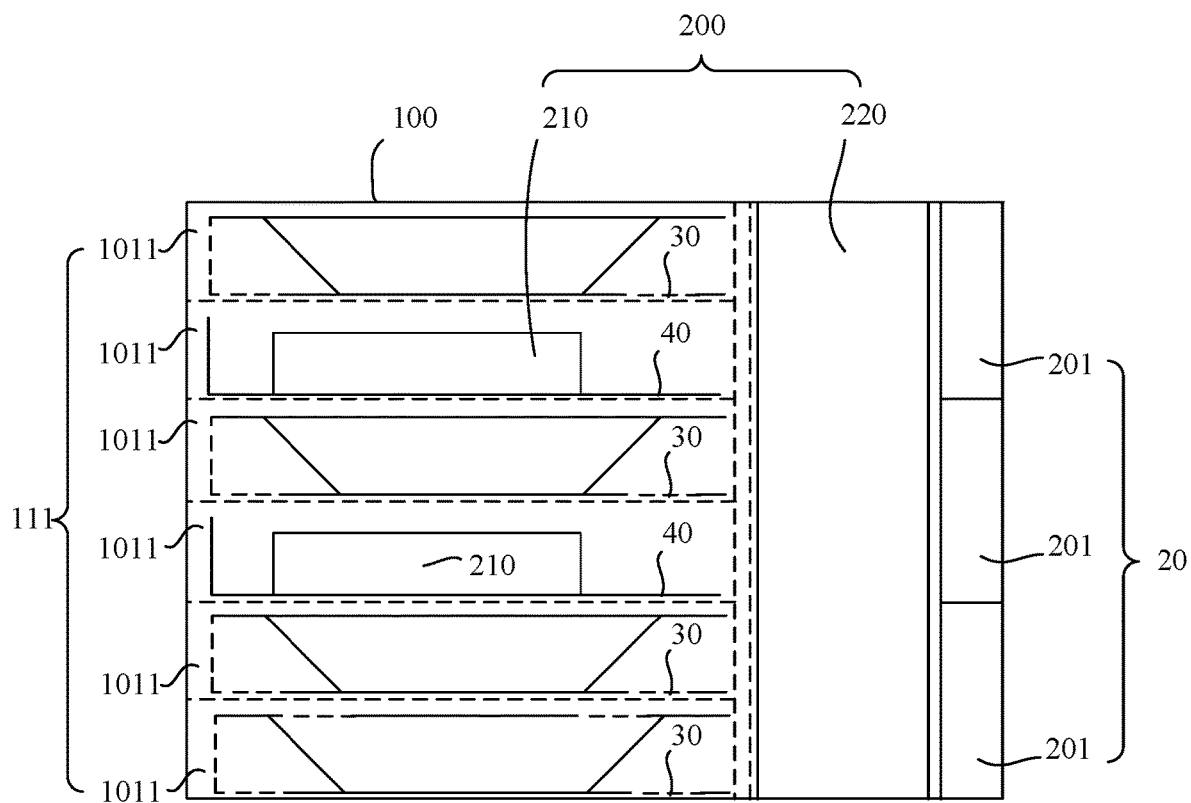
FIG. 10 is a schematic diagram of a structure of an electronic device according to an embodiment of this disclosure.

FIG. 10 shows an electronic device according to an embodiment of this disclosure. The electronic device includes a cabinet 100 and an electronic component 200.

The cabinet 100 is the cabinet 100 provided above. The electronic component 200 includes a line card 210 and a switch fabric unit 220. The line card 210 is located in the slot 1011 and is connected to the service carrier board 40, and the switch fabric unit 220 is located in the cabinet 100 and is sandwiched between the slot space 101 and the fan group 20.

The line card 210 is mounted on the service carrier board 40 to be inserted into the slot 1011 together with the service carrier board 40. In this way, heat in the line card can be well dissipated by the cabinet 100. The switch fabric unit 220 is directly mounted in the cabinet 100 and is located between the slot space 101 and the fan group 20, so that an airflow flowing out of the slot space 101 can further flow through the switch fabric unit 220, and after dissipating heat for the switch fabric unit 220, the airflow is guided out of the fan group 20 to exchange heat with the outside.

In other words, in the electronic device provided in embodiments of this disclosure, the cabinet 100 is configured to carry the electronic component 200 to provide a mounting basis and a heat dissipation condition for the electronic component 200. Since the line card 210 of the electronic device is mounted on the service carrier board 40, and the service carrier board 40 is located in the slot 1011, an airflow flowing in the slot 1011 can dissipate heat well for the line card 210. In this way, the line card 210 is in an appropriate working temperature, thereby ensuring normal operation of the line card 210. Since the switch fabric unit 220 of the electronic device is mounted in the cabinet 100 and is located between the slot space 101 and the fan group 20, an airflow flowing out of the slot space 101 can further dissipate heat well for the switch fabric unit 220. In this way, the switch fabric unit 220 is in an appropriate working temperature, thereby ensuring normal operation of the switch fabric unit 220. It can be seen that, the electronic device provided in embodiments of this disclosure can ensure good heat dissipation of the electronic device, thereby ensuring normal and stable operation of the electronic device.

In addition, when the air deflection plug-in units 30 shown in FIG. 3, FIG. 6, and FIG. 8 are configured in the cabinet 100, the cabinet 100 correspondingly has corresponding beneficial effects, and the electronic device also correspondingly has corresponding beneficial effects. Details are not described herein.

In an exemplary embodiment, the electronic device is a data center switch of an orthogonal architecture, where line cards 210 are horizontally arranged, and switch fabric units 220 are perpendicular to a horizontal plane, that is, the line cards 210 and the switch fabric units 220 are perpendicular to each other, and the line cards 210 and the switch fabric units 220 are connected through an orthogonal connector, to implement high-speed data transmission. In this design, a transmission distance between the line card 210 and the switch fabric unit 220 is shorter, and there are fewer fault points, thereby improving performance of the electronic device, and improving reliability of the electronic device.

The following briefly describes an assembly procedure of the electronic device provided in embodiments of this disclosure.

First, the fans 201 are sequentially mounted in the cabinet body 10 from bottom to top, so that the fans 201 are located on one side of the slot space 101, that is, on the right side in FIG. 10.

Then, the switch fabric units 220 are sequentially mounted in the cabinet body 10 in sequence, so that the fans 201 are located on one side of the fans 201, that is, on the left side in FIG. 10.

Further, the service carrier board 40 is selected. A quantity of service carrier boards 40 is selected according to a quantity of line cards 210, and sizes of air vents (the first air intake vent 1a, the second air intake vent 1c, the third air intake vent 1d, the first air exhaust vent 1b, and the second air exhaust vent 1e) of the service carrier boards 40 are selected according to heat dissipation requirements.

Furthermore, the line card 210 is mounted on a corresponding service carrier board 40, and the service carrier board 40 is inserted into a vacant slot 1011. To ensure a heat dissipation effect of each of the service carrier boards 40, the service carrier boards 40 are evenly spaced in the slot space 101, so as to avoid excessive concentration of the service carrier boards 40.

Finally, the air deflection plug-in units 30 are inserted into remaining vacant slots 1011.

Figure 11:
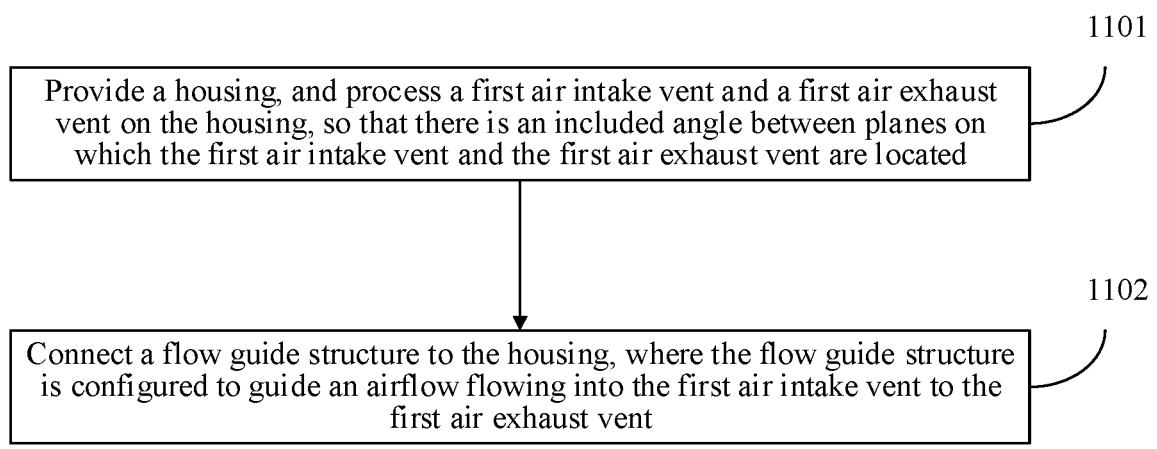
FIG. 11 is a flowchart of a manufacturing method for an air deflection plug-in unit according to an embodiment of this disclosure.

FIG. 11 is a flowchart of a manufacturing method for an air deflection plug-in unit according to an embodiment of this disclosure. The manufacturing method is used to manufacture any air deflection plug-in unit shown in FIG. 3 to FIG. 9. With reference to FIG. 11, the manufacturing method includes the following steps.

Step 1101: Provide a housing 1, and process a first air intake vent 1a and a first air exhaust vent 1b on the housing 1, so that there is an included angle between planes on which the first air intake vent 1a and the first air exhaust vent 1b are located.

Step 1102: Connect a flow guiding structure 2 to the housing 1, where the flow guiding structure 2 is configured to guide an airflow flowing into the first air intake vent 1a to the first air exhaust vent 1b.

For the air deflection plug-in unit manufactured by performing the manufacturing method provided in embodiments of this disclosure, since there is an included angle between the planes on which the first air intake vent 1a and the first air exhaust vent 1b are located, overflowing directions of the first air intake vent 1a and the first air exhaust vent 1b are different, that is, directions of airflows flowing through the first air intake vent 1a and the first air exhaust vent 1b are different from each other. In this way, direction change and guiding of the airflow can be implemented. In addition, since the flow guiding structure 2 can guide the airflow flowing into the first air intake vent 1a to the first air exhaust vent 1b, direction change and guiding of the airflow can be implemented through the air deflection plug-in unit.

When the air deflection plug-in unit manufactured by performing the manufacturing method provided in embodiments of this disclosure is applied to a cabinet, the fan group 20 operates to form airflows that flow through the slot space 101. Some airflows flow through a slot 1011 in which the service carrier board 40 is inserted, to directly dissipate heat for the line card 210 mounted on the service carrier board 40. Some other airflows flow through a slot 1011 in which the air deflection plug-in unit 30 is inserted. Since the air deflection plug-in unit 30 can guide airflows in the slot 1011 in which the air deflection plug-in unit is located to an adjacent slot 1011, the airflows are finally guided to the slot 1011 in which the service carrier board 40 is inserted, which can also dissipate heat for the line card 210 mounted on the service carrier board 40. As can be seen from the above, air can enter both the slot 1011 in which the service carrier board 40 is inserted and the slot 1011 in which the air deflection plug-in unit 30 is inserted, that is, the slot space 101 can receive all airflows generated by the fan group 20, thereby ensuring the total air intake volume. In addition, all the airflows received by the slot space 101 can be used to dissipate heat for the line card 210 on the service carrier board 40, thereby resolving the problem of airflow overflow, and ensuring the heat dissipation effect. In addition, since the air deflection plug-in unit 30 no longer blocks airflows, noise generated due to airflow impact is also reduced.

The foregoing specific implementations further describe the objectives, technical solutions in detail, and beneficial effects of this disclosure. It may be understood that the foregoing descriptions are merely specific implementations of this disclosure, but are not intended to limit the protection scope of this disclosure. Any modification, equivalent replacement, or improvement made based on the technical solutions of this disclosure shall fall within the protection scope of this disclosure.

What is claimed is:

1. An air deflection plug-in unit, applied to a cabinet, the air deflection plug-in unit comprising a housing and a flow guiding structure; wherein the housing is provided with a first air intake vent and a first air exhaust vent, with an included angle being formed between planes on which the first air intake vent and the first air exhaust vent are located; and the flow guiding structure is located in the housing and configured to guide an airflow flowing into the first air intake vent to the first air exhaust vent; wherein the housing comprises an upper cover plate, a lower cover plate, and an end plate; the upper cover plate and the lower cover plate are opposite to each other; the end plate is located between the upper cover plate and the lower cover plate, one side edge of the end plate is connected to one side edge of the upper cover plate, and the other opposite side edge of the end plate is connected to one side edge of the lower cover plate; the flow guiding structure comprises a first air deflector located between the upper cover plate and the lower cover plate, one side edge of the first air deflector is connected to the upper cover plate, and the other opposite side edge of the first air deflector is connected to the lower cover plate; and the upper cover plate, the lower cover plate, the end plate, and the first air deflector enclose a first space, the first air intake vent is located at a position corresponding to the end plate in the first space, and the first air exhaust vent is located at a position corresponding to the lower cover plate in the first space.

2. The air deflection plug-in unit according to claim 1, wherein the first air deflector is inclined from one side edge to the other opposite side edge in a direction away from the first air exhaust vent.

3. The air deflection plug-in unit according to claim 1, wherein the flow guiding structure further comprises a second air deflector located on one side of the first air deflector away from the end plate and located between the upper cover plate and the lower cover plate, one side edge of the second air deflector is connected to the upper cover plate, and the other opposite side edge of the second air deflector is connected to the lower cover plate; and the upper cover plate, the lower cover plate, and one side of the second air deflector away from the first air deflector enclose a second space, and a second air intake vent is provided at a position corresponding to the lower cover plate in the second space.

4. The air deflection plug-in unit according to claim 3, wherein the second air deflector is inclined from one side edge to the other opposite side edge in a direction away from the second air intake vent.

5. The air deflection plug-in unit according to claim 3, wherein the upper cover plate, the lower cover plate, the first air deflector, and the second air deflector enclose a third space, and a third air intake vent and a second air exhaust vent are respectively provided at positions corresponding to the upper cover plate in the third space.

6. A cabinet, comprising a cabinet body, a fan group, one or more air deflection plug-in units, and a service carrier board, wherein a slot space is provided in the cabinet body and is formed by a plurality of slots that are stacked in sequence and are in communication with each other, the plurality of slots are configured to accommodate the one or more air deflection plug-in units or the service carrier board; the fan group is located in the cabinet body, and the fan group and the slot space are arranged side by side to form airflows flowing through the slot space; each air deflection plug-in unit is detachably inserted into one of the plurality of slots to guide an airflow in a slot in which the air deflection plug-in unit is located to an adjacent slot; the service carrier board is detachably inserted into at least one of the plurality of slots to carry a line card; each air deflection plug-in unit comprises a housing and a flow guiding structure; the housing is provided with a first air intake vent and a first air exhaust vent, with an included angle being formed between planes on which the first air intake vent and the first air exhaust vent are located; and the flow guiding structure is located in the housing and configured to guide an airflow flowing into the first air intake vent to the first air exhaust vent; wherein the housing comprises an upper cover plate, a lower cover plate, and an end plate; the upper cover plate and the lower cover plate are opposite to each other; the end plate is located between the upper cover plate and the lower cover plate, one side edge of the end plate is connected to one side edge of the upper cover plate, and the other opposite side edge of the end plate is connected to one side edge of the lower cover plate; the flow guiding structure comprises a first air deflector located between the upper cover plate and the lower cover plate, one side edge of the first air deflector is connected to the upper cover plate, and the other opposite side edge of the first air deflector is connected to the lower cover plate; and the upper cover plate, the lower cover plate, the end plate, and the first air deflector enclose a first space, the first air intake vent is located at a position corresponding to the end plate in the first space, and the first air exhaust vent is located at a position corresponding to the lower cover plate in the first space.

7. The cabinet according to claim 6, wherein the one or more air deflection plug-in units comprise a plurality of air deflection plug-in units having various sizes in at least one of an air intake vent or an air exhaust vent.

8. The cabinet according to claim 6, wherein the fan group comprises a plurality of fans sequentially arranged side by side in a stacking direction of the plurality of slots.

9. The cabinet according to claim 6, wherein the first air deflector is inclined from one side edge to the other opposite side edge in a direction away from the first air exhaust vent.

10. The cabinet according to claim 6, wherein the flow guiding structure further comprises a second air deflector, the second air deflector is located on one side of the first air deflector away from the end plate and is located between the upper cover plate and the lower cover plate, one side edge of the second air deflector is connected to the upper cover plate, and the other opposite side edge of the second air deflector is connected to the lower cover plate; and the upper cover plate, the lower cover plate, and one side of the second air deflector away from the first air deflector enclose a second space, and a second air intake vent is provided at a position corresponding to the lower cover plate in the second space.

11. The cabinet according to claim 10, wherein the second air deflector is inclined from one side edge to the other opposite side edge in a direction away from the second air intake vent.

12. The cabinet according to claim 10, wherein the upper cover plate, the lower cover plate, the first air deflector, and the second air deflector enclose a third space, and a third air intake vent and a second air exhaust vent are respectively provided at positions corresponding to the upper cover plate in the third space.

13. An electronic device, comprising a cabinet and an electronic component, wherein
the cabinet comprises a cabinet body, a fan group, one or more air deflection plug-in units, and a service carrier board, wherein
a slot space is provided in the cabinet body and is formed by a plurality of slots that are stacked in sequence and are in communication with each other, the plurality of slots are configured to accommodate the one or more air deflection plug-in units or a service carrier board;
the fan group is located in the cabinet body, and the fan group and the slot space are arranged side by side to form airflows flowing through the slot space;
each air deflection plug-in unit is detachably inserted into one of the plurality of slots to guide an airflow in a slot in which the air deflection plug-in unit is located to an adjacent slot;
the service carrier board is detachably inserted into at least one of the plurality of slots to carry a line card; and
each air deflection plug-in unit comprises a housing and a flow guiding structure, the housing is provided with a first air intake vent and a first air exhaust vent, an included angle is formed between planes on which the first air intake vent and the first air exhaust vent are located, the flow guiding structure is located in the housing and configured to guide an airflow flowing into the first air intake vent to the first air exhaust vent; and
the electronic component comprises the line card and a switch fabric unit, the switch fabric unit is located in the cabinet and is sandwiched between the slot space and the fan group.

14. The electronic device according to claim 13, wherein the one or more air deflection plug-in units comprise a plurality of air deflection plug-in units having various sizes in at least one of an air intake vent or an air exhaust vent.

15. The electronic device according to claim 13, wherein the fan group comprises a plurality of fans sequentially arranged side by side in a stacking direction of the plurality of slots.

16. The electronic device according to claim 13, wherein the housing comprises an upper cover plate, a lower cover plate, and an end plate;
the upper cover plate and the lower cover plate are opposite to each other;
the end plate is located between the upper cover plate and the lower cover plate, one side edge of the end plate is connected to one side edge of the upper cover plate, and the other opposite side edge of the end plate is connected to one side edge of the lower cover plate;

the flow guiding structure comprises a first air deflector located between the upper cover plate and the lower cover plate, one side edge of the first air deflector is connected to the upper cover plate, and the other opposite side edge of the first air deflector is connected to the lower cover plate; and the upper cover plate, the lower cover plate, the end plate, and the first air deflector enclose a first space, the first air intake vent is located at a position corresponding to the end plate in the first space, and the first air exhaust vent is located at a position corresponding to the lower cover plate in the first space.

17. The electronic device according to claim 13, wherein the first air deflector is inclined from one side edge to the other opposite side edge in a direction away from the first air exhaust vent.

18. The electronic device according to claim 16, wherein the flow guiding structure further comprises a second air deflector, the second air deflector is located on one side of the first air deflector away from the end plate and is located between the upper cover plate and the lower cover plate, one side edge of the second air deflector is connected to the upper cover plate, and the other opposite side edge of the second air deflector is connected to the lower cover plate; and the upper cover plate, the lower cover plate, and one side of the second air deflector away from the first air deflector enclose a second space, and a second air intake vent is provided at a position corresponding to the lower cover plate in the second space.

* * * * *